US012672227B2

(12) United States Patent
Tanaka et al.

(10) Patent No.: US 12,672,227 B2
(45) Date of Patent: Jun. 30, 2026

(54) WIRING CIRCUIT BOARD AND METHOD OF PRODUCING THE WIRING CIRCUIT BOARD

(71) Applicant: NITTO DENKO CORPORATION, Osaka (JP)

(72) Inventors: Tomoaki Tanaka, Osaka (JP); Hayato Takakura, Osaka (JP); Ryosuke Sasaoka, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 76 days.

(21) Appl. No.: 18/658,450

(22) Filed: May 8, 2024

(65) Prior Publication Data

US 2024/0397609 A1 Nov. 28, 2024

(30) Foreign Application Priority Data

May 23, 2023 (JP) ................................. 2023-084736

(51) Int. Cl.
*H05K 1/02* (2006.01)
*H05K 3/18* (2006.01)

(52) U.S. Cl.
CPC ............. *H05K 1/0219* (2013.01); *H05K 3/18* (2013.01); *H05K 1/028* (2013.01); *H05K 2203/0723* (2013.01)

(58) Field of Classification Search
CPC .................................................. H05K 1/0219
See application file for complete search history.

(56) References Cited

U.S. PATENT DOCUMENTS

| | | | |
|---|---|---|---|
| 2016/0270216 A1* | 9/2016 | Fujimura | ............. G11B 5/4846 |
| 2021/0185798 A1 | 6/2021 | Yoshida et al. | |
| 2023/0147342 A1* | 5/2023 | Shibata | .................. H05K 1/024 |
| | | | 174/250 |
| 2023/0156914 A1 | 5/2023 | Fujimura | |
| 2024/0164017 A1* | 5/2024 | Matsui | ................. H05K 3/4007 |
| 2024/0284600 A1* | 8/2024 | Takakura | ............... H05K 3/007 |
| 2025/0040029 A1* | 1/2025 | Saito | .................... H05K 1/0281 |

FOREIGN PATENT DOCUMENTS

| | | |
|---|---|---|
| JP | 2016-184091 A | 10/2016 |
| JP | 2021-093507 A | 6/2021 |
| JP | 2021-128813 A | 9/2021 |
| JP | 2023-024323 A | 2/2023 |

* cited by examiner

*Primary Examiner* — Hung V Ngo

(74) *Attorney, Agent, or Firm* — Edwards Neils LLC; Jean C. Edwards, Esq.

(57) ABSTRACT

A wiring circuit board includes a first insulating layer, a wiring pattern disposed at one side of the first insulating layer in a thickness direction and including a terminal and a wire connected with the terminal, and a shield pattern disposed at the one side of the first insulating layer in the thickness direction and spaced apart from and adjacent to a part of the wire. The wire is made of a first conductive layer, and the shield pattern is made of a second conductive layer.

19 Claims, 10 Drawing Sheets

1

WIRING CIRCUIT BOARD AND METHOD OF PRODUCING THE WIRING CIRCUIT BOARD

CROSS-REFERENCE TO RELATED APPLICATION

The present application claims priority from Japanese Patent Application No. 2023-084736 filed on May 23, 2023, the content of which is hereby incorporated by reference into this application.

TECHNICAL FIELD

The present invention relates to a wiring circuit board and a method of producing the wiring circuit board.

BACKGROUND ART

There has been a conventionally known wiring circuit board including a plurality of wiring bodies in which wires are disposed and a coupling body in which terminals connected to the wires are disposed and which couples one end portions of the wiring bodies (for example, see Patent document 1 below).

CITATION LIST

Patent Document

Patent Document 1: Japanese Unexamined Patent Publication No. 2023-024323

SUMMARY OF THE INVENTION

Problem to be Solved by the Invention

A shield may be required around the wires in the wiring circuit board as describe in Patent Document 1.

However, there is a little space in which the shield can be disposed in the wiring circuit board as describe in Patent Document 1. Thus, it can be considered that there is a case in which while a shield is disposed around the wires in the coupling body, a shield is not disposed in the wiring body.

In such a case, one wire has a part around which the shield is disposed and a part around which a shield is not disposed.

As described above, in a case in which one wire has a part around which the shield is disposed and a part around which a shield is not disposed, when the wire and the shield are simultaneously formed, for example, by electrolytic plating, the part around which the shield is disposed may more thinly be formed than the part around which a shield is not disposed.

Then, the thickness of the part around which the shield is disposed may be excessively smaller than the designed value while the thickness of the part around which a shield is not disposed may be excessively larger than the designed value.

In light thereof, the present invention provides a wiring circuit board that can suppress the occurrence of difference in thickness between a part of a wire that is adjacent to a shield pattern and the remaining part of the wire that is not adjacent to the shield pattern, and a method of producing the wiring circuit board.

Means for Solving the Problem

The present invention [1] includes a wiring circuit board comprising: an insulating layer; a wiring pattern disposed at one side of the insulating layer in a thickness direction of the insulating layer and including a terminal and a wire connected with the terminal; and a shield pattern disposed at the one side of the insulating layer in the thickness direction and spaced apart from and adjacent to a part of the wire, wherein the wire is made of a first conductive layer, and wherein the shield pattern is made of a second conductive layer.

According to the configuration described above, the wire is made of the first conductive layer, and the shield pattern is made of the second conductive layer.

Therefore, each of the wire and the shield pattern can be formed in a different step. In this manner, the formation of the shield pattern does not affect that of the wire.

As a result, the occurrence of difference in thickness between a part of a wire that is adjacent to a shield pattern and the remaining part of the wire that is not adjacent to the shield pattern can be suppressed.

The present invention [2] includes a wiring circuit board comprising: an insulating layer; a wiring pattern disposed at one side of the insulating layer in a thickness direction of the insulating layer and including a terminal and a wire connected with the terminal; and a shield pattern disposed at the one side of the insulating layer in the thickness direction and is spaced apart from and adjacent to a part of the wire, wherein the shield pattern has an opening.

According to the configuration described above, the shield pattern has an opening. In other words, the area of the shield pattern can be reduced by the area of the opening.

Therefore, even when the shield pattern and the wire are simultaneously formed, the influence of the formation of the shield pattern on that of the wire can be suppressed.

As a result, the occurrence of difference in thickness between a part of a wire that is adjacent to a shield pattern and the remaining part of the wire that is not adjacent to the shield pattern can be suppressed.

The present invention [3] includes the wiring circuit board described in the above-described [2], wherein the wire is made of a first conductive layer, and wherein the shield pattern is made of a second conductive layer.

According to the configuration described above, each of the wire and the shield pattern can be formed in a different step. In this manner, the formation of the shield pattern does not affect that of the wire.

As a result, the occurrence of difference in thickness between a part of a wire that is adjacent to a shield pattern and the remaining part of the wire that is not adjacent to the shield pattern can further be suppressed.

The present invention [4] includes the wiring circuit board described in the above-described [1] or [3], wherein the terminal includes: a first layer disposed at the one side of the insulating layer in the thickness direction and made of the first conductive layer; and a second layer disposed at one side of the first layer in the thickness direction and made of the second conductive layer.

The present invention [5] includes the wiring circuit board described in the above-described [1] or [3], wherein the terminal includes: a first layer disposed at the one side of the insulating layer in the thickness direction and made of the second conductive layer; and a second layer disposed at one side of the first layer in the thickness direction and made of the first conductive layer.

The present invention [6] includes the wiring circuit board described in any one of the above-described [1] and [3] to [5], wherein the second conductive layer is thicker than the first conductive layer.

The present invention [7] includes the wiring circuit board described in any one of the above-described [1] and [3] to [5], wherein the first conductive layer is thicker than the second conductive layer.

The present invention [8] includes the wiring circuit board described in any one of the above-described [1] to [7], wherein the wiring circuit board includes: a frame portion on which the terminal is disposed; and a flexible portion which is connected with the frame portion and more flexible than the frame portion, and on which the wire is disposed, wherein the shield pattern is disposed on the frame portion and is not disposed on the flexible portion.

According to the configuration described above, without reducing the flexibility of the flexible portion, the shield pattern is disposed around the wire in the frame portion.

The present invention [9] includes the wiring circuit board described in any one of the above-described [1] to [8], further including: a metal supporting layer disposed at the other side of the insulating layer in the thickness direction.

According to the configuration described above, the metal supporting layer can surround the wire from the other side of the insulating layer in the thickness direction.

As a result, the transmission of the noise produced from the wire to the other side of the insulating layer and the transmission of the noise from the other side of the insulating layer to the wire can be suppressed.

The present invention includes the wiring circuit board described in the above-described [9], wherein the shield pattern is electrically connected with the metal supporting layer.

The present invention includes a method of producing the wiring circuit board described in any one of the above-described [1] to [10], the method comprising: a wire formation step of forming the wire at the one side of the insulating layer in the thickness direction; and a shield pattern formation step of forming the shield pattern at the one side of the insulating layer in the thickness direction.

According to the method, each of the wire and the shield pattern can be formed in a different step. In this manner, the formation of the shield pattern does not affect that of the wire.

As a result, the occurrence of difference in thickness between a part of a wire that is adjacent to a shield pattern and the remaining part of the wire that is not adjacent to the shield pattern can be suppressed.

Effects of the Invention

According to the present invention, the occurrence of difference in wire thickness between a part of a wire that is adjacent to a shield pattern and the remaining part of the wire that is not adjacent to the shield pattern can be suppressed.

BRIEF DESCRIPTION OF THE DRAWINGS

FIG. 3A shows a step of forming a first insulating layer. FIG. 3B shows a step of forming a wire. FIG. 3C shows a step of forming a shield pattern.

DESCRIPTION OF THE EMBODIMENT

1. Wiring Circuit Board

Figure 1:
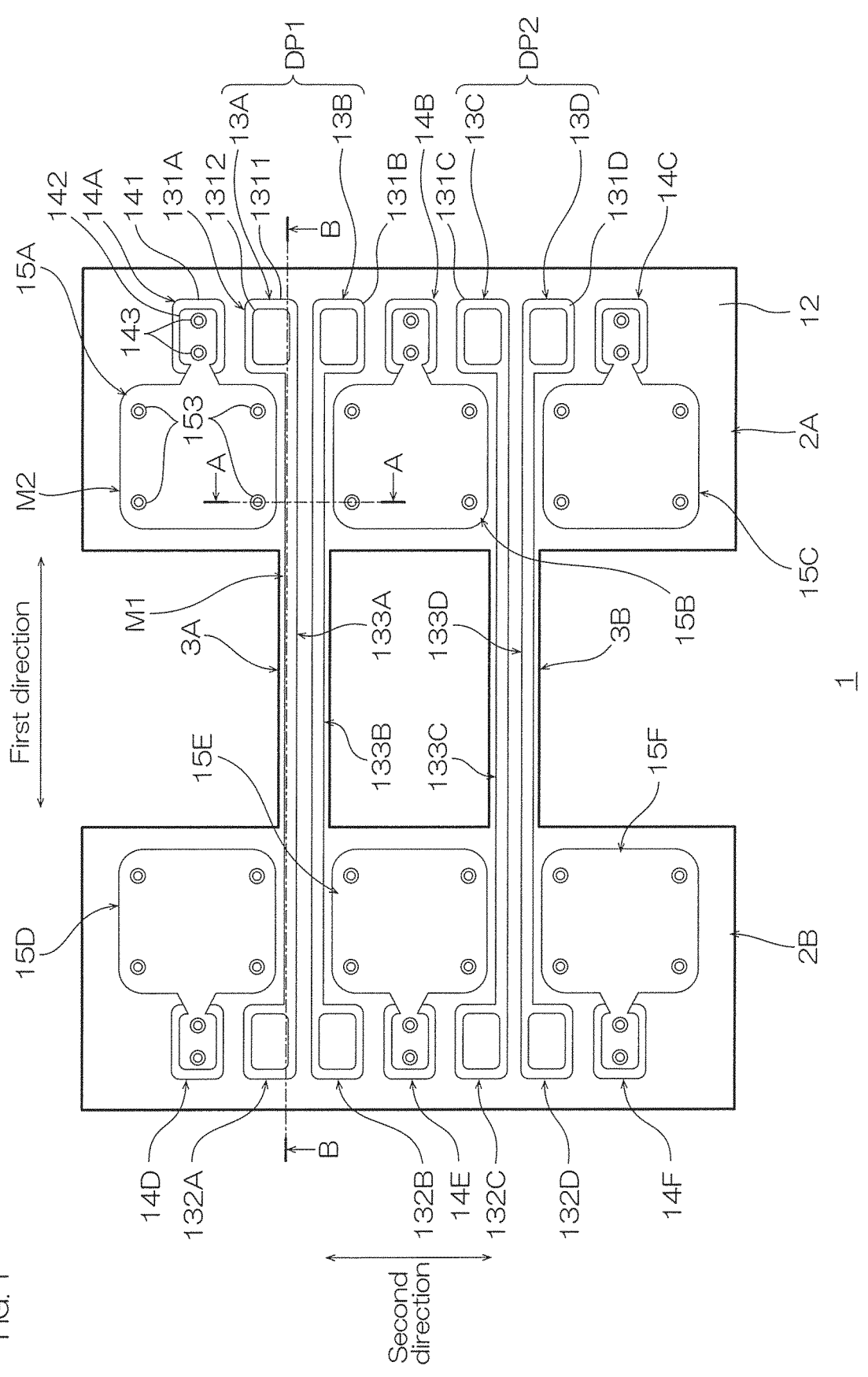
FIG. 1 is a plan view of a wiring circuit board of one embodiment of the present invention.

As shown in FIG. 1, a wiring circuit board 1 has two frame portions 2A and 2B and a plurality of flexible portions 3A and 3B.

The frame portion 2B is disposed away from the frame portion 2A in a first direction. The first direction is orthogonal to a thickness direction of the wiring circuit board 1. Each of the frame portions 2A and 2B extends in a second direction. The second direction is orthogonal to both of the first direction and the thickness direction.

The flexible portions 3A and 3B connect the frame portion 2A with the frame portion 2B. The flexible portions 3A and 3B are disposed between the frame portion 2A and the frame portion 2B in the first direction. In the present embodiment, each of the flexible portions 3A and 3B extends in the first direction. One end portion of each of the flexible portions 3A and 3B in the first direction is connected with the frame portion 2A. The other end portion of each of the flexible portions 3A and 3B in the first direction is connected with the frame portion 2B. The shape of each of the flexible portions 3A and 3B is not limited. Each of the flexible portions 3A and 3B may have the shape of a straight line or may be curved. The flexible portions 3A and 3B are arranged in the second direction. In other words, the flexible portions 3A and 3B are arranged in a direction in which the frame portion 2A extends. The flexible portion 3B is disposed away from the flexible portion 3A in the second direction.

Each of the flexible portions 3A and 3B has a width of, for example, 300 μm or less, preferably 250 μm or less. Each of the flexible portions 3A and 3B has a width of, for example, 10 μm or more, preferably 30 μm or more.

The "width" is a maximum length in a direction orthogonal to both of the direction in which the flexible portion extends and the thickness direction. For example, the "width" of the flexible portion 3A is its maximum length in the direction orthogonal to both of the direction in which the flexible portion 3A extends and the thickness direction. In the present embodiment, the "width" is a maximum length in the second direction.

The width of each of the flexible portions 3A and 3B is smaller than that of the frame portion 2A in the second direction. Thus, each of the flexible portions 3A and 3B is more flexible than the frame portion 2A.

Figure 2A:
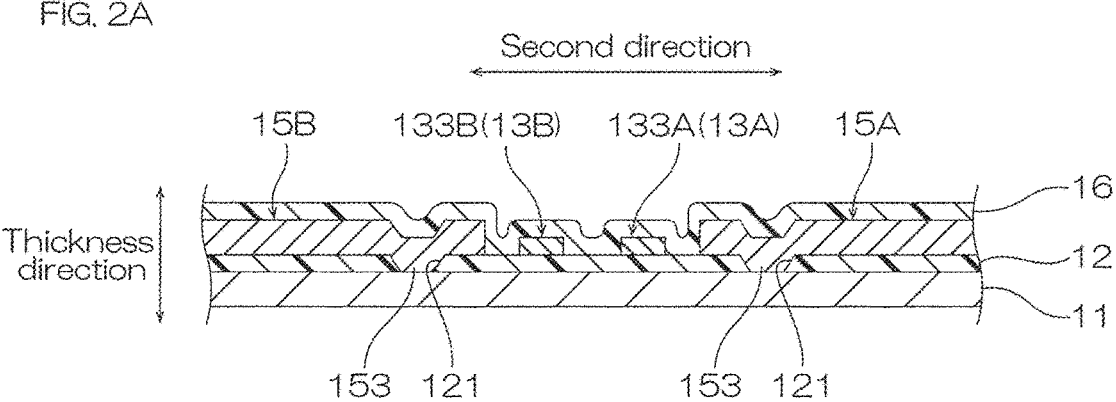
FIG. 2A is a cross-sectional view of the wiring circuit board shown in FIG. 1, taken along line A-A.

As shown in FIG. 1 and FIG. 2A, the wiring circuit board 1 includes a metal supporting layer 11, a first insulating layer 12, a plurality of wiring patterns 13A, 13B, 13C, and 13D, and a plurality of ground terminals 14A, 14B, 14C, 14D, 14E, and 14F, a plurality of shield patterns 15A, 15B, 15C, 15D, 15E, and 15F, and a second insulating layer 16.

(1) Metal Supporting Layer

The metal supporting layer 11 is disposed on the frame portions 2A and 2B and the flexible portions 3A and 3B. The metal supporting layer 11 supports the first insulating layer 12, the wiring patterns 13A, 13B, 13C, and 13D, the plurality of ground terminals 14A, 14B, 14C, 14D, 14E, and 14F, the shield patterns 15A, 15B, 15C, 15D, 15E, and 15F, and the second insulating layer 16. Examples of the material of the metal supporting layer 11 include copper, a copper alloy, a stainless steel, nickel, titanium, and Alloy 42. As the material of the metal supporting layer 11, a copper alloy is preferably used. The metal supporting layer 11 may be composed of one metal layer or a plurality of metal layers. Preferably, the metal supporting layer 11 includes a metal layer made of a copper alloy.

(2) First Insulating Layer

The first insulating layer 12 is disposed on the frame portions 2A and 2B and the flexible portions 3A and 3B. The first insulating layer 12 is disposed at one side of the metal supporting layer 11 in the thickness direction. In other words, the metal supporting layer 11 is disposed at the other side of the first insulating layer 12 in the thickness direction. The first insulating layer 12 is disposed on one surface of the metal supporting layer 11 in the thickness direction. The first insulating layer 12 is disposed between the metal supporting layer 11 and the wiring patterns 13A, 13B, 13C, and 13D. The first insulating layer 12 is also disposed between the metal supporting layer 11 and the ground terminals 14A, 14B, 14C, 14D, 14E, and 14F and between the metal supporting layer 11 and the shield patterns 15A, 15B, 15C, 15D, 15E, and 15F. The first insulating layer 12 insulates the wiring patterns 13A, 13B, 13C, and 13D, the ground terminals 14A, 14B, 14C, 14D, 14E, and 14F, and the shield patterns 15A, 15B, 15C, 15D, 15E, and 15F from the metal supporting layer 11. The first insulating layer 12 is made of resin. Examples of the resin include polyimide, maleimide, epoxy resin, polybenzoxazole, and polyester. The first insulating layer 12 has a plurality of penetrating holes 121.

(3) Wiring Patterns

The wiring patterns 13A, 13B, 13C (see FIG. 1), and 13D (see FIG. 1) are disposed at one side of the first insulating layer 12 in the thickness direction. The wiring patterns 13A, 13B, 13C, and 13D are disposed on one surface of the first insulating layer 12 in the thickness direction. The wiring patterns 13A, 13B, 13C, and 13D are insulated from the metal supporting layer 11 by the first insulating layer 12. The wiring patterns 13A, 13B, 13C, and 13D are signal wires for transmitting electrical signals. As shown in FIG. 1, the wiring pattern 13A and the wiring pattern 13B are composed of a first differential pair DP1. The wiring pattern 13C and the wiring pattern 13D are composed of a second differential pair DP2.

The wiring pattern 13A includes a terminal 131A, a terminal 132A, and a wire 133A. The wiring pattern 13B includes a terminal 131B, a terminal 132B, and a wire 133B. The wiring pattern 13C includes a terminal 131C, a terminal 132C, and a wire 133C. The wiring pattern 13D includes a terminal 131D, a terminal 132D, and a wire 133D.

(3-1) Terminals 131A, 131B, 131C, and 131D.

The terminals 131A, 131B, 131C, and 131D are disposed on the frame portion 2A. In a state in which a first electron element or a first wiring circuit board other than the wiring circuit board 1 is mounted on the frame portion 2A of the wiring circuit board 1, each of the terminals 131A, 131B, 131C, and 131D is connected with the first electron element or the first wiring circuit board. In the present embodiment, the terminals 131A, 131B, 131C, and 131D are arranged in the second direction. Each of the terminals 131A, 131B, 131C, and 131D has a square land shape. The direction in which the terminals 131A, 131B, 131C, and 131D are arranged and the shape of each of the terminals 131A, 131B, 131C, and 131D are not limited.

Figure 2B:
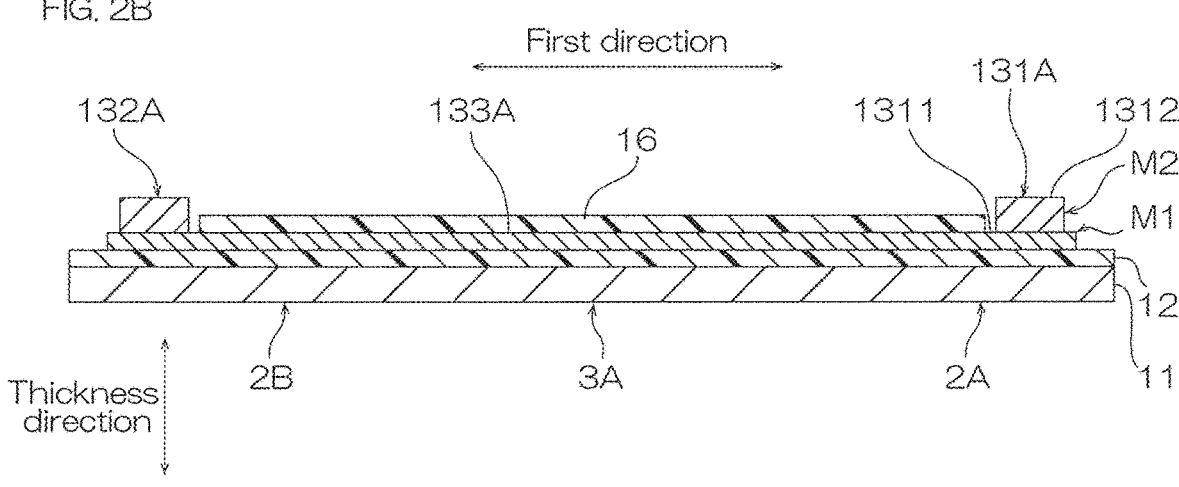
FIG. 2B is a cross-sectional view of the wiring circuit board shown in FIG. 1, taken along line B-B.

As shown in FIG. 2B, the terminal 131A has a first layer 1311 and a second layer 1312.

The first layer 1311 is disposed at the one side of the first insulating layer 12 in the thickness direction. The first layer 1311 is disposed on the one surface of the first insulating layer 12 in the thickness direction. Examples of the first layer 1311 include a metal. Examples of the metal include copper, silver, gold, iron, aluminum, chromium, and an alloy thereof. In view of obtaining a good electrical property, copper is preferably used.

The second layer 1312 is disposed at the one side of the first layer 1311 in the thickness direction. The second layer 1312 is disposed on one surface of the first layer 1311 in the thickness direction. The second layer 1312 is thicker than the first layer 1311. Examples of the material of the second layer 1312 includes the same metals of the material of the first layer 1311. The second layer 1312 is preferably made of the same metal as the first layer 1311.

The terminals 131B, 131C, and 131D have the same layer structure as that of the terminal 131A. Thus, the descriptions of the layer structure of each of the terminals 131B, 131C, and 131D are omitted.

(3-2) Terminals 132A, 132B, 132C, and 132D

As shown in FIG. 1, the terminals 132A, 132B, 132C, and 132D are disposed on the frame portion 2B. In a state in which a second electron element or a second wiring circuit board other than the wiring circuit board 1 is mounted on the frame portion 2B of the wiring circuit board 1, each of the terminals 132A, 132B, 132C, and 132D is connected with the second electron element or the second wiring circuit board. In the present embodiment, the terminals 132A, 132B, 132C, and 132D are arranged in the second direction. Each of the terminals 132A, 132B, 132C, and 132D has a square land shape. The direction in which the terminal 132A, 132B, 132C, and 132D are arranged and the shape of each of the terminal 132A, 132B, 132C, and 132D are not limited.

The terminals 132A, 132B, 132C, and 132D have the same layer structure as that of the terminal 131A. Thus, the descriptions of the layer structure of each of the terminals 132A, 132B, 132C, and 132D are omitted.

(3-3) Wires 133A, 133B, 133C, and 133D

One end portion of the wire 133A is disposed on the frame portion 2A. The one end portion of the wire 133A is connected with the terminal 131A. The other end portion of the wire 133A is disposed on the frame portion 2B. The other end portion of the wire 133A is connected to the terminal 132A. The terminal 131A is electrically connected to the terminal 132A through the wire 133A. The wire 133A is disposed on the flexible portion 3A between the frame portion 2A and the frame portion 2B.

One end portion of the wire 133B is disposed on the frame portion 2A. The one end portion of the wire 133B is connected with the terminal 131B. The other end portion of the wire 133B is disposed on the frame portion 2B. The other end portion of the wire 133B is connected to the terminal 132B. The terminal 131B is electrically connected to the terminal 132B through the wire 133B. The wire 133B is disposed on the flexible portion 3A between the frame portion 2A and the frame portion 2B. The wire 133B extends parallel to the wire 133A. The wire 133B preferably has the same length as that of the wire 133A.

One end portion of the wire 133C is disposed on the frame portion 2A. The one end portion of the wire 133C is connected with the terminal 131C. The other end portion of the wire 133C is disposed on the frame portion 2B. The other end portion of the wire 133C is connected to the terminal 132C. The terminal 131C is electrically connected to the terminal 132C through the wire 133C. The wire 133C is disposed on the flexible portion 3B between the frame portion 2A and the frame portion 2B.

One end portion of the wire 133D is disposed on the frame portion 2A. The one end portion of the wire 133D is connected with the terminal 131D. The other end portion of the wire 133D is disposed on the frame portion 2B. The other end portion of the wire 133D is connected to the terminal 132D. The terminal 131D is electrically connected to the terminal 132D through the wire 133D. The wire 133D is disposed on the flexible portion 3B between the frame portion 2A and the frame portion 2B. The wire 133D extends parallel to the wire 133C. The wire 133D preferably has the same length as that of the wire 133C.

The wires 133A, 133B, 133C, and 133D are made of the same metal as that of the first layer 1311 of the terminal 131A.

(4) Ground Terminals

As shown in FIG. 1, the ground terminals 14A, 14B, and 14C are disposed on the frame portion 2A. The ground terminals 14D, 14E, and 14F are disposed on the frame portion 2B. The ground terminals 14A, 14B, 14C, 14D, 14E, and 14F are independent from the wiring patterns 13A, 13B, 13C, and 13D. The ground terminals 14A, 14B, 14C, 14D, 14E, and 14F are not connected with the wiring patterns 13A, 13B, 13C, and 13D. In a state in which a first electron element or a first wiring circuit board other than the wiring circuit board 1 is mounted on the frame portion 2A of the wiring circuit board 1, each of the ground terminals 14A, 14B, and 14C is connected with the first electron element or the first wiring circuit board. Furthermore, in a state in which a second electron element or a second wiring circuit board other than the wiring circuit board 1 is mounted on the frame portion 2B of the wiring circuit board 1, each of the ground terminals 14D, 14E, and 14F is connected with the second electron element or the second wiring circuit board.

The ground terminal 14A is spaced apart from and adjacent to the terminal 131A in the second direction. The ground terminal 14A is disposed at one side of the terminal 131A in the second direction. The ground terminal 14A is disposed at a side opposite to the terminal 131B with respect to the terminal 131A in the second direction.

The ground terminal 14A is not adjacent to the wire 133A. The distance between the ground terminal 14A and the wire 133A is longer than the distance between the ground terminal 14A and the terminal 131A. The distance between the ground terminal 14A and the wire 133A is longer than the distance between a first layer 141 and the wire 133A.

In the present embodiment, the ground terminal 14A has a square land shape. The ground terminal 14A has the first layer 141, a second layer 142, and a plurality of ground vias 143.

The first layer 141 is made of the same metal as that of the first layer 1311 of the terminal 131A.

The second layer 142 is made of the same metal as that of the second layer 1312 of the terminal 131A. In other words, the ground terminal 14A has the same layer structure as that of the terminal 131A. The shape of the ground terminal 14A and the layer structure of the ground terminal 14A are not limited.

The ground vias 143 pass through the penetrating holes not illustrated of the first insulating layer 12 and are brought into contact with the metal supporting layer 11. In this manner, the ground terminal 14A is electrically connected to the metal supporting layer 11.

The ground terminal 14B is spaced apart from and adjacent to the terminal 131B in the second direction. The ground terminal 14B is disposed at the other side of the terminal 131B in the second direction. The ground terminal 14B is disposed at a side opposite to the terminal 131A with respect to the terminal 131B in the second direction.

The ground terminal 14B is disposed at one side of the terminal 131C in the second direction. In other words, the ground terminal 14B is disposed between the terminal 131B and the terminal 131C in the second direction. The ground terminal 14B is disposed at a side opposite to the terminal 131D with respect to the terminal 131C in the second direction.

The ground terminal 14C is spaced apart from and adjacent to the terminal 131D in the second direction. The ground terminal 14C is disposed at the other side of the terminal 131D in the second direction. The ground terminal 14C is disposed at a side opposite to the terminal 131C with respect to the terminal 131D in the second direction.

The ground terminal 14D is spaced apart from and adjacent to the terminal 132A in the second direction. The ground terminal 14D is disposed at one side of the terminal 132A in the second direction. The ground terminal 14D is disposed at a side opposite to the terminal 132B with respect to the terminal 132A in the second direction.

The ground terminal 14E is spaced apart from and adjacent to the terminal 132B in the second direction. The ground terminal 14E is disposed at the other side of the terminal 132B in the second direction. The ground terminal 14E is disposed at a side opposite to the terminal 132A with respect to the terminal 132B in the second direction.

The ground terminal 14E is disposed at one side of the terminal 132C in the second direction. In other words, the ground terminal 14E is disposed between the terminal 132B and the terminal 132C in the second direction. The ground terminal 14E is disposed at a side opposite to the terminal 132D with respect to the terminal 132C in the second direction.

The ground terminal 14F is spaced apart from and adjacent to the terminal 132D in the second direction. The ground terminal 14F is disposed at the other side of the terminal 132D in the second direction. The ground terminal 14F is disposed at a side opposite to the terminal 132C with respect to the terminal 132D in the second direction.

In the present embodiment, each of the ground terminals 14B, 14C, 14D, 14E, and 14F has the same shape and the same layer structure as those of the ground terminal 14A. Each of the ground terminals 14B, 14C, 14D, 14E, and 14F may have a different shape and a different layer structure from those of the ground terminal 14A.

(5) Shield Patterns

The shield patterns 15A, 15B, 15D, and 15E suppress the transmission of a noise generated from the wiring patterns 13A and 13B (the first differential pair DP1) to an external portion (for example, the wiring patterns 13C and 13D (the second differential pair DP2)) and the transmission of a noise from an external portion (for example, the wiring patterns 13C and 13D (the second differential pair DP2)) to the wiring patterns 13A and 13B. Furthermore, the shield patterns 15B, 15C, 15E, and 15F suppress the transmission of a noise generated from the wiring patterns 13C and 13D (the second differential pair DP2) to an external portion (for example, the wiring patterns 13A and 13A (the first differential pair DP1)) and the transmission of a noise from an external portion (for example, the wiring patterns 13A and 13B (the first differential pair DP1)) to the wiring patterns 13C and 13D.

As shown in FIG. 1, the shield patterns 15A, 15B, and 15C are disposed on the frame portion 2A. The shield patterns 15A, 15B, and 15C are independent from the wiring patterns 13A, 13B, 13C, and 13D. The shield patterns 15A, 15B, and 15C are not connected with the wiring patterns 13A, 13B, 13C, and 13D.

The shield pattern 15A and the shield pattern 15B surround one end portion of the first differential pair DP1 together with the ground terminal 14A and the ground terminal 14B. The one end portion of the first differential pair DP1 is disposed between the ground terminal 14A and the ground terminal 14B and between the shield pattern 15A and the shield pattern 15B in the second direction.

The shield pattern 15A is disposed at one side of the first differential pair DP1 in the second direction. The shield pattern 15A is disposed at a side opposite to the wire 133B with respect to the wire 133A in the second direction. The shield pattern 15A is spaced apart from and adjacent to a part of the wire 133A in the second direction. In the present embodiment, the shield pattern 15A has an approximately rectangular flat board shape. The shape of the shield pattern 15A is not limited. The shield pattern 15A is connected to the ground terminal 14A.

The shield pattern 15B is disposed away from the shield pattern 15A in the second direction. The shield pattern 15B is disposed at the other side of the first differential pair DP1 in the second direction. The shield pattern 15B is disposed at a side opposite to the wire 133A with respect to the wire 133B in the second direction. The shield pattern 15B is connected to the ground terminal 14B.

Furthermore, the shield pattern 15B is disposed at one side of the second differential pair DP2 in the second direction. The shield pattern 15B is disposed at a side opposite to the wire 133D with respect to the wire 133C in the second direction.

The shield pattern 15B and the shield pattern 15C surround one end portion of the second differential pair DP2 together with the ground terminal 14B and the ground terminal 14C. The one end portion of the second differential pair DP2 is disposed between the ground terminal 14B and the ground terminal 14C and between the shield pattern 15B and the shield pattern 15C in the second direction.

The shield pattern 15C is disposed away from the shield pattern 15B in the second direction. The shield pattern 15C is disposed at the other side of the second differential pair DP2 in the second direction. The shield pattern 15C is disposed at a side opposite to the wire 133C with respect to the wire 133D in the second direction. The shield pattern 15C is connected to the ground terminal 14C.

The shield patterns 15D, 15E, and 15F are disposed on the frame portion 2B. A shield pattern is not disposed on the flexible portions 3A and 3B. The shield patterns 15D, 15E, and 15F are independent from the wiring patterns 13A, 13B, 13C, and 13D. The shield patterns 15D, 15E, and 15F are not connected with the wiring patterns 13A, 13B, 13C, and 13D.

The shield pattern 15D and the shield pattern 15E surround the other end portion of the first differential pair DP1 together with the ground terminal 14D and the ground terminal 14E. The other end portion of the first differential pair DP1 is disposed between the ground terminal 14D and the ground terminal 14E and between the shield pattern 15D and the shield pattern 15E in the second direction.

The shield pattern 15D is disposed at one side of the first differential pair DP1 in the second direction. The shield pattern 15D is disposed at a side opposite to the wire 133B with respect to the wire 133A in the second direction. The shield pattern 15D is connected to the ground terminal 14D.

The shield pattern 15E is disposed away from the shield pattern 15D in the second direction. The shield pattern 15E is disposed at the other side of the first differential pair DP1 in the second direction. The shield pattern 15E is disposed at a side opposite to the wire 133A with respect to the wire 133B in the second direction. The shield pattern 15E is connected to the ground terminal 14E.

Furthermore, the shield pattern 15E is disposed at one side of the second differential pair DP2 in the second direction. The shield pattern 15E is disposed at a side opposite to the wire 133D with respect to the wire 133C in the second direction.

The shield pattern 15E and the shield pattern 15F surround the other end portion of the second differential pair DP2 together with the ground terminal 14E and the ground terminal 14F. The other end portion of the second differential pair DP2 is disposed between the ground terminal 14E and the ground terminal 14F and between the shield pattern 15E and the shield pattern 15F in the second direction.

The shield pattern 15F is disposed away from the shield pattern 15E in the second direction. The shield pattern 15F is disposed at the other side of the second differential pair DP2 in the second direction. The shield pattern 15F is disposed at a side opposite to the wire 133C with respect to the wire 133D in the second direction. The shield pattern 15F is connected to the ground terminal 14F.

In the present embodiment, each of the shield patterns 15B, 15C, 15D, 15E, and 15F has the same shape as that of the shield pattern 15A. Each of the shield patterns 15B, 15C, 15D, 15E, and 15F may have a different shape from that of the shield pattern 15A.

As shown in FIG. 2A, the shield patterns 15A, 15B, 15C, 15D, 15E, and 15F are disposed on the one side of the first insulating layer 12 in the thickness direction. The shield patterns 15A, 15B, 15C, 15D, 15E, and 15F are disposed on the one surface of the first insulating layer 12 in the thickness direction. Each of the shield patterns 15A, 15B, 15C, 15D, 15E, and 15F has a plurality of shield vias 153. The shield vias 153 pass through the penetrating holes 121 of the first insulating layer 12 and are in contact with the metal supporting layer 11. In this manner, each of the shield patterns 15A, 15B, 15C, 15D, 15E, and 15F is electrically connected to the metal supporting layer 11.

(6) Second Insulating Layer

As shown in FIG. 2A, the second insulating layer 16 covers all the wires 133A, 133B, 133C, and 133D and all the shield patterns 15A, 15B, 15C, 15D, 15E, and 15F. The second insulating layer 16 is disposed on the one surface of the first insulating layer 12 in the thickness direction. As shown in FIG. 2B, the second insulating layer 16 does not cover the terminals 131A, 131B, 131C, and 131D, the terminals 132A, 132B, 132C, and 132D, and the ground terminals 14A, 14B, 14C, 14D, 14E, and 14F. The second insulating layer 16 is made of resin. Examples of the resin include polyimide, maleimide, epoxy resin, polybenzoxazole, and polyester.

2. Method of Producing Wiring Circuit Board 1

A method of producing the wiring circuit board 1 include a first insulating layer formation step (see FIG. 3A), a wire formation step (see FIG. 3B), a shield pattern formation step (see FIG. 3C), a second insulating layer formation step, and an outer shape trimming step.

(1) First Insulating Layer Formation Step

Figure 3A:
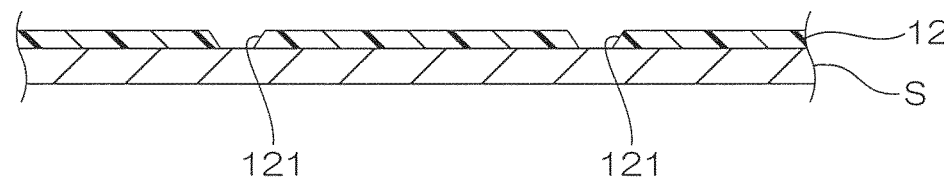
FIGS. 3A to 3C are views for explaining a method of producing the wiring circuit board shown in FIG. 1.

As shown in FIG. 3A, in the first insulating layer formation step, the first insulating layer 12 is formed at one side of a substrate S in the thickness direction. The substrate S is metal foil pulled out of a roll of metal foil. The material of the substrate S is the same as that of the metal supporting layer 11 (see FIG. 2A). In the first insulating layer formation step, the first insulating layer 12 is formed on one surface of the substrate S in the thickness direction.

To form the first insulating layer 12, first, a solution (varnish) of photosensitive resin is applied on the substrate S and dried to form a coating film of the photosensitive resin. Next, the coating film of the photosensitive resin is exposed to light and developed. In this manner, the first insulating layer 12 is formed into a predetermined pattern on the substrate S.

(2) Wire Formation Step

Figure 3B:
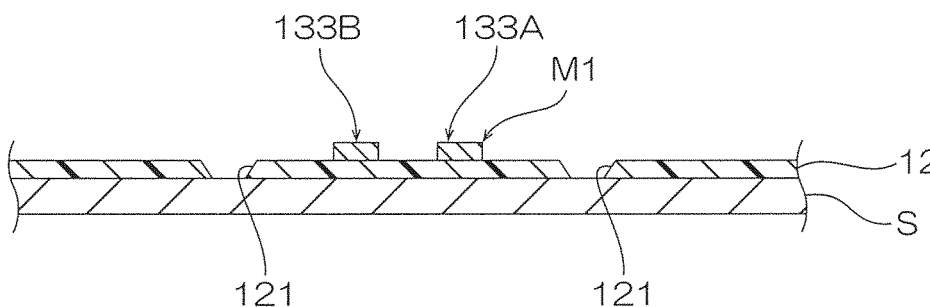

Next, as shown in FIG. 3B, in the wire formation step, the wires 133A, 133B, 133C, and 133D are formed at the one side of the first insulating layer 12 in the thickness direction. In detail, in the wire formation step, a first conductive layer M1 is formed at the one side of the first insulating layer 12 in the thickness direction by electrolytic plating.

Figure 4:
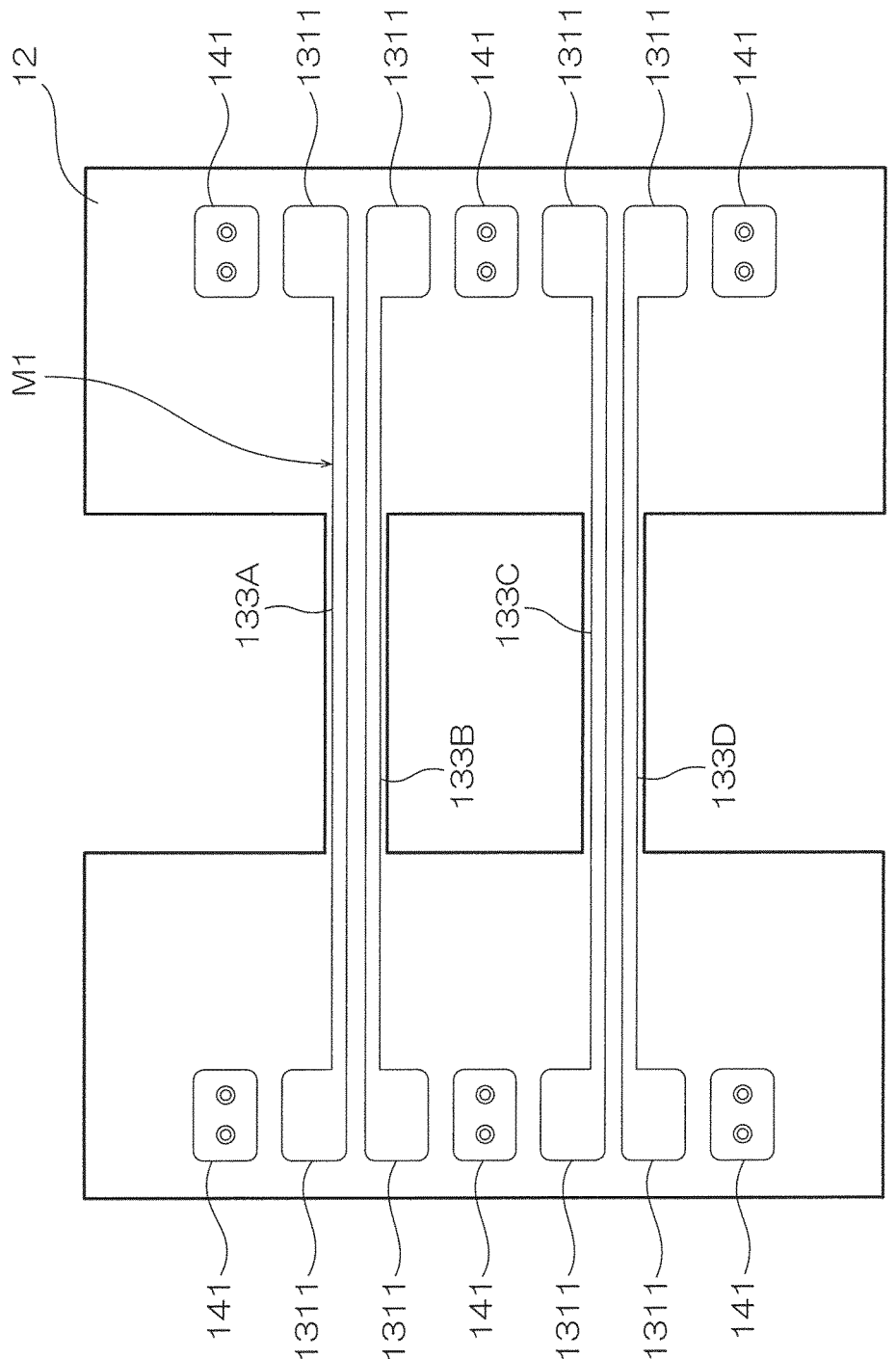
FIG. 4 is a plan view of the first conductive layer formed in the step of forming the wire shown in FIG. 3B.

As shown in FIG. 4, the first conductive layer M1 includes the first layer 1311 of each of the above-described terminals 131A, 131B, 131C, 131D, 132A, 132B, 132C, and 132D, the first layer 141 of each of the above-described ground terminals 14A, 14B, 14C, 14D, 14E, and 14F, and the wires 133A, 133B, 133C, and 133D. In other words, the first layer 1311 of each of the terminals 131A, 131B, 131C, 131D, 132A, 132B, 132C, and 132D, and the wires 133A, 133B, 133C, and 133D are made of the first conductive layer M1.

To form the first conductive layer M1, first, a seed layer is formed on surfaces of the first insulating layer 12 and the substrate S. The seed layer is formed, for example, by sputtering. Examples of the material of the seed layer include chromium, copper, nickel, titanium, and an alloy thereof.

Next, a plating resist is attached onto the first insulating layer 12 and substrate S on which the seed layer has been formed. Then, the plating resist is exposed to light in a state in which a part on which the first conductive layer M1 is to be formed is shielded from light.

Next, the exposed plating resist is developed. Then, the plating resist of the shielded part is removed, and the seed layer is exposed in the part on which the first conductive layer M1 is to be formed. The plating resist of the exposed part, namely, the part on which the first conductive layer M1 is not to be formed remains.

Next, the first conductive layer M1 is formed on the exposed seed layer by electrolytic plating.

After the completion of the electrolytic plating, the plating resist is released.

(3) Shield Pattern Formation Step

Figure 3C:
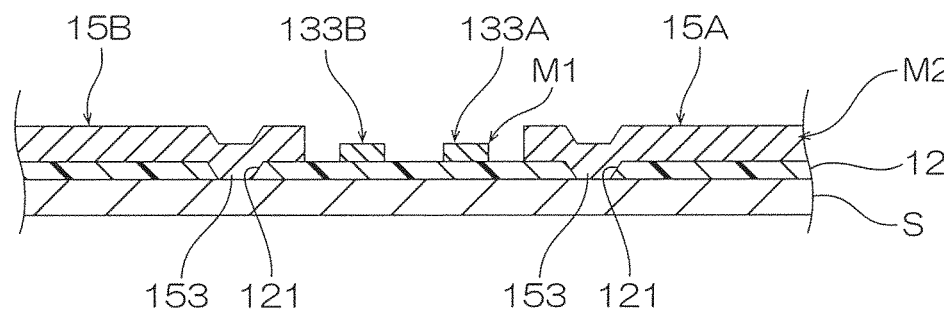

Next, as shown in FIG. 3C, in the shield pattern formation step, the shield patterns 15A, 15B, 15C, 15D, 15E, and 15F are formed at the one side of the first insulating layer 12 in the thickness direction. In detail, in the shield pattern formation step, the second conductive layer M2 is formed at the one side of the first insulating layer 12 in the thickness direction by electrolytic plating.

As shown in FIG. 1, the second conductive layer M2 includes the second layer 1312 of each of the above-described terminals 131A, 131B, 131C, 131D, 132A, 132B, 132C, and 132D, the second layer 142 of each of the above-described ground terminals 14A, 14B, 14C, 14D, 14E, and 14F, and the above-described shield patterns 15A, 15B, 15C, 15D, 15E, and 15F. In other words, the second layer 1312 of each of the terminals 131A, 131B, 131C, 131D, 132A, 132B, 132C, and 132D and the shield patterns 15A, 15B, 15C, 15D, 15E, and 15F are made of the second conductive layer M2. That is to say, the shield pattern 15A is made of a different conductive layer (the second conductive layer M2) from the wire 133A. The second conductive layer M2 is thicker than the first conductive layer M1.

To form the second conductive layer M2, first, a plating resist is attached onto the first insulating layer 12, the substrate S, and the first conductive layer M1. Then, the plating resist is exposed to light in a state in which a part on which the second conductive layer M2 is to be formed is shielded from light.

Next, the exposed plating resist is developed. Then, the plating resist of the shielded part is removed, and the seed layer or the first conductive layer M1 is exposed in the part on which the second conductive layer M2 is to be formed. The plating resist of the exposed part, namely, the part on which the second conductive layer M2 is not to be formed remains.

Next, the second conductive layer M2 is formed on the exposed seed layer or the exposed first conductive layer M1 by electrolytic plating.

After the completion of the electrolytic plating, the plating resist is released. Thereafter, the seed layer that was] covered with the plating resist is removed by etching.

(4) Second Insulating Layer Formation Step

Next, as shown in FIG. 2A, in the second insulating layer formation step, the second insulating layer 16 is formed on the first insulating layer 12, the wiring patterns 13A, 13B, 13C, and 13D, and the shield patterns 15A, 15B, 15C, 15D, 15E, and 15F in the same manner as the formation of the first insulating layer 12.

(5) Outer Shape Trimming Step

Next, for example, by etching the metal supporting layer 11, an outer shape of the wiring circuit board 1 is formed. In this manner, the wiring circuit board 1 is produced.

3. Operations and Effects (1) According to the wiring circuit board 1, as shown in FIG. 4, the wire 133A is made of the first conductive layer M1. As shown in FIG. 1, the shield pattern 15A adjacent to the wire 133A is made of the second conductive layer M2.

Thus, each of the wire 133A and the shield pattern 15A can be formed in a different step. In detail, as shown in FIG. 3B and FIG. 4, the wire 133A is formed in the wire formation step. As shown in FIG. 3C and FIG. 1, the shield pattern 15A can be formed in the shield pattern formation step. Therefore, the formation of the shield pattern 15A does not affect the formation of the wire 133A.

As a result, the occurrence of difference in thickness between a part of the wire 133A disposed on the frame portion 2A and adjacent to the shield pattern 15A and the remaining part of the wire 133A disposed on the flexible portion 3A and not adjacent to the shield pattern 15A can be suppressed.

(2) According to the wiring circuit board 1, as shown in FIG. 1, the shield patterns 15A, 15B, 15C, 15D, 15E, and 15F are disposed on the frame portion 2A or the frame portion 2B but are not disposed on the flexible portions 3A and 3B.

Thus, without the decrease in flexibility of the flexible portions 3A and 3B, the shield patterns 15A, 15B, 15C, 15D, 15E, and 15F can be formed around the wires 133A, 133B, 133C, and 133D in the frame portions 2A and 2B.

(3) According to the wiring circuit board 1, as shown in FIG. 2A, the metal supporting layer 11 is disposed at the other side of the first insulating layer 12 in the thickness direction.

Therefore, by the metal supporting layer 11, the wires 133A and 133B can be surrounded from the other side of the first insulating layer 12 in the thickness direction.

As a result, the transmission of a noise generated from the wires 133A and 133B to the other side of the first insulating layer 12 and the transmission of a noise from the other side of the first insulating layer 12 to the wires 133A and 133B can be suppressed.

(4) The method of producing the wiring circuit board 1 includes the wire formation step of forming the wire 133A at the one side of the first insulating layer 12 in the thickness direction (see FIG. 3B and FIG. 4) and the shield pattern formation step of forming the shield pattern 15A at the one side of the first insulating layer 12 in the thickness direction (see FIG. 3C and FIG. 1).

Thus, each of the wire 133A and the shield pattern 15A can be formed in a different step. In this manner, the formation of the shield pattern 15A does not affect the formation of the wire 133A.

As a result, the occurrence of difference in thickness between a part of the wire 133A disposed on the frame portion 2A and adjacent to the shield pattern 15A and the remaining part of the wire 133A disposed on the flexible portion 3A and not adjacent to the shield pattern 15A can be suppressed.

4. Variations

Variations are described below. In the variations, the same members as in the above-described embodiment are given the same reference numerals, and the descriptions thereof are omitted.

Figure 5:
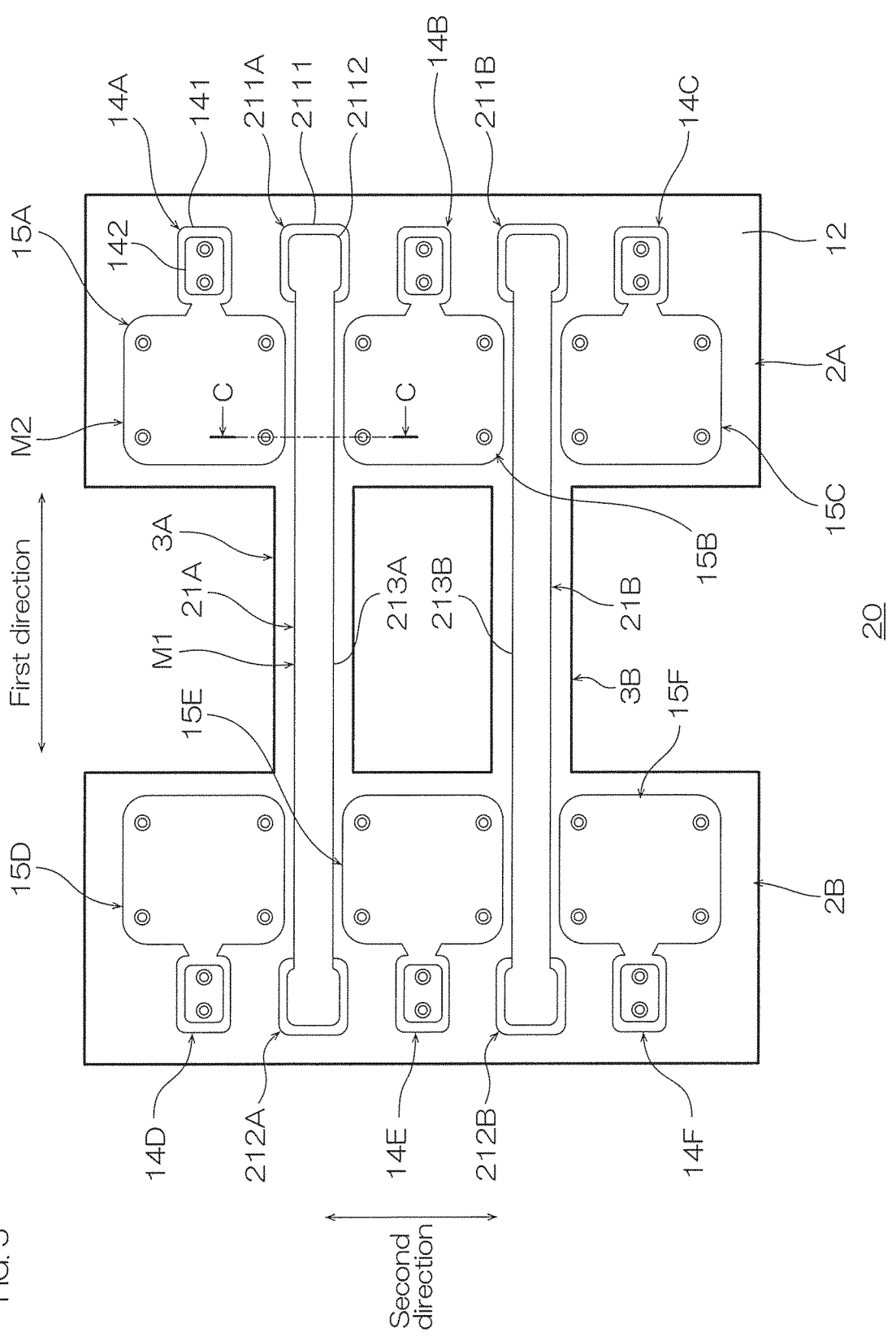
FIG. 5 is a plan view of the wiring circuit board of a variation (1).

(1) The wiring pattern is not limited to a signal wire. As shown in FIG. 5, a wiring circuit board 20 may include wiring patterns 21A and 21B as power source wires.

The wiring pattern 21A includes a terminal 211A, a terminal 212A, and a wire 213A. The wiring pattern 21B has a terminal 211B, a terminal 212B, and a wire 213B.

The terminals 211A and 211B are disposed on the frame portion 2A. The terminals 211A and 211B are arranged in the second direction. Each of the terminals 211A and 211B has a square land shape. The direction in which the terminals 211A and 211B are arranged and the shape of each of the terminals 211A and 211B are not limited.

The terminal 211A has a first layer 2111 and a second layer 2112.

The first layer 2111 is disposed at the one side of the first insulating layer 12 in the thickness direction. The first layer 2111 is disposed on the one surface of the first insulating layer 12 in the thickness direction.

The second layer 2112 is disposed at one side of the first layer 2111 in the thickness direction. The second layer 2112 is disposed on one surface of the first layer 2111 in the thickness direction.

The terminals 212A and 212B are disposed on the frame portion 2B. The terminals 212A and 212B are arranged in the second direction. Each of the terminals 212A and 212B has a square land shape. The direction in which the terminals

212A and 212B are arranged and the shape of each of the terminals 212A and 212B are not limited.

The terminals 211B, 212A, and 212B have the same layer structure as that of the terminal 211A. Thus, the descriptions of the layer structure of each of the terminals 211B, 212A, and 212B are omitted.

One end portion of the wire 213A is disposed on the frame portion 2A. The one end portion of the wire 213A is connected with the terminal 211A. The other end portion of the wire 213A is disposed on the frame portion 2B. The other end portion of the wire 213A is connected to the terminal 212A. The terminal 211A is electrically connected to the terminal 212A through the wire 213A. The wire 213A is disposed on the flexible portion 3A between the frame portion 2A and the frame portion 2B.

One end portion of the wire 213B is disposed on the frame portion 2A. The one end portion of the wire 213B is connected with the terminal 211B. The other end portion of the wire 213B is disposed on the frame portion 2B. The other end portion of the wire 213B is connected to the terminal 212B. The terminal 211B is electrically connected to the terminal 212B through the wire 213B. The wire 213B is disposed on the flexible portion 3B between the frame portion 2A and the frame portion 2B.

Figure 6:
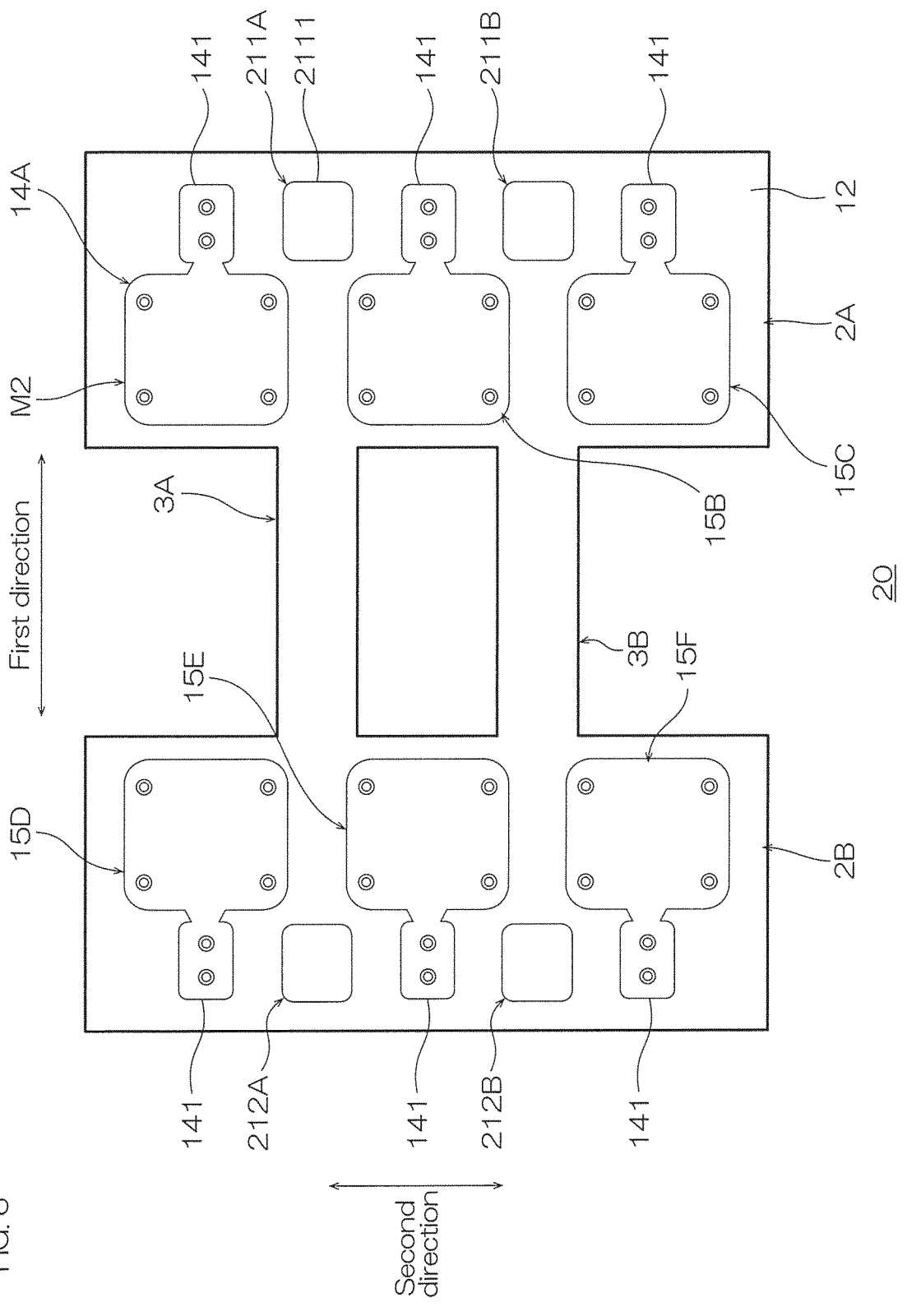
FIG. 6 is a plan view of the second conductive layer formed in the step of forming the shield pattern in the production of the wiring circuit board shown in FIG. 5.

In this variation, the wire formation step (see FIG. 5) is carried out after the shield pattern formation step (see FIG. 6).

In detail, as shown in FIG. 6, in the shield pattern formation step, the shield patterns 15A, 15B, 15C, 15D, 15E, and 15F are formed at the one side of the first insulating layer 12 in the thickness direction. In detail, in the shield pattern formation step, the second conductive layer M2 is formed at the one side of the first insulating layer 12 in the thickness direction by electrolytic plating.

The second conductive layer M2 includes the first layer 2111 of each of the above-described terminals 211A, 211B, 212A, and 212B, the first layer 141 of each of the above-described ground terminals 14A, 14B, 14C, 14D, 14E, and 14F, and the above-described shield patterns 15A, 15B, 15C, 15D, 15E, and 15F. In other words, the first layer 2111 of each of the terminals 211A, 211B, 212A, and 212B is made of the second conductive layer M2. That is to say, in this variation, the first layer 2111 of each of the terminals 211A, 211B, 212A, and 212B is made of the same conductive layer (second conductive layer M2) as those of the shield patterns 15A, 15B, 15C, 15D, 15E, and 15F.

Next, as shown in FIG. 5, in the wire formation step, the wires 213A and 213B are formed at the one side of the first insulating layer 12 in the thickness direction. In detail, in the wire formation step, the first conductive layer M1 is formed on the one side of the first insulating layer 12 in the thickness direction by electrolytic plating.

The first conductive layer M1 includes the second layer 2112 of each of the above-described terminals 211A, 211B, 212A, and 212B, the wires 213A and 213B, and the second layer 142 of each of the above-described ground terminals 14A, 14B, 14C, 14D, 14E, and 14F. In other words, the second layer 2112 of each of the terminals 211A, 211B, 212A, and 212B is made of the first conductive layer M1. That is to say, in this variation, the second layer 2112 of each of the terminals 211A, 211B, 212A, and 212B is made of the same conductive layer (first conductive layer M1) as those of the wires 213A and 213B. Furthermore, also in this variation, the shield patterns 15A, 15B, 15C, 15D, 15E, and 15F are made of a different conductive layer (second conductive layer M2) from those of the wires 213A and 213B.

Figure 7:
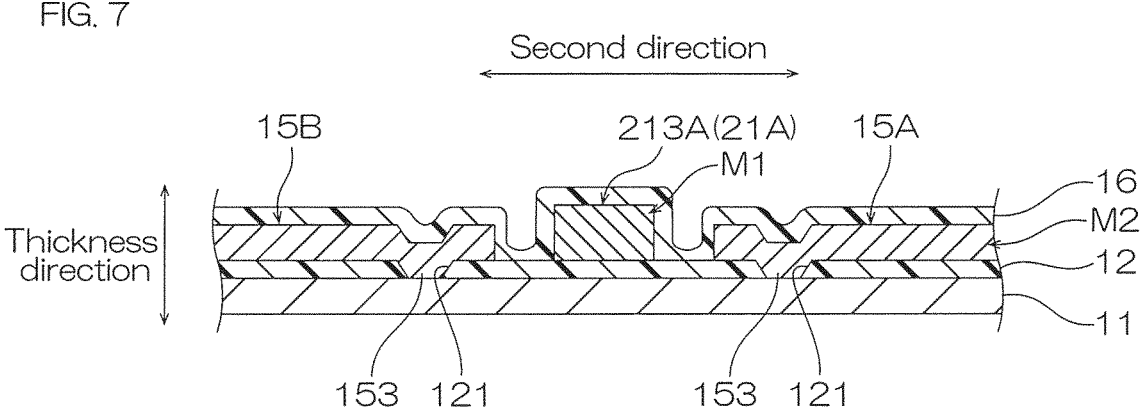
FIG. 7 is a cross-sectional view of the wiring circuit board shown in FIG. 5, taken along line C-C.

As shown in FIG. 7, according to this variation, the first conductive layer M1 is thicker than the second conductive layer M2.

Figure 8:
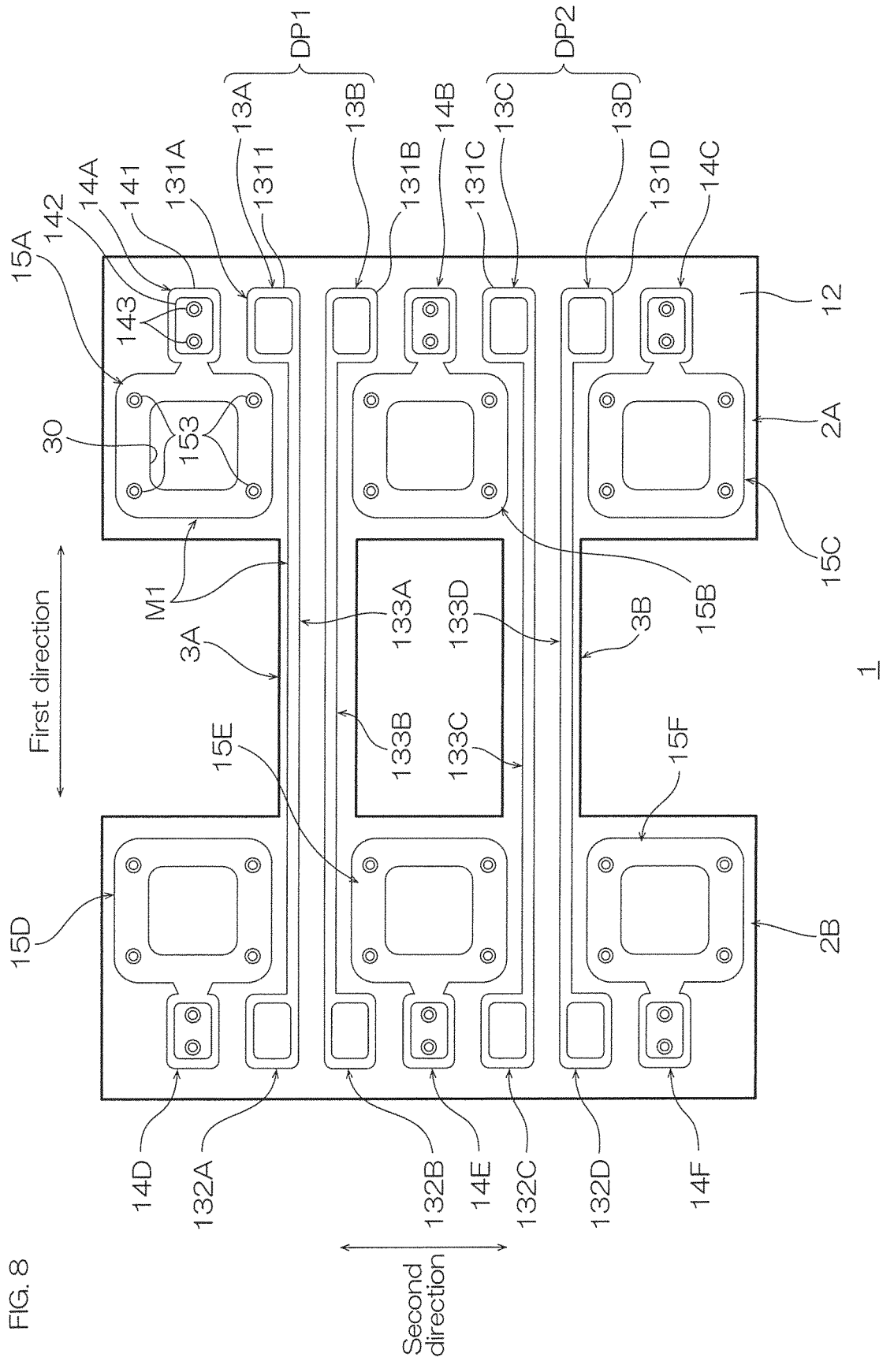
FIG. 8 is a plan view of the wiring circuit board of a variation (2).

(2) As shown in FIG. 8, the shield patterns 15A, 15B, 15C, 15D, 15E, and 15F may be formed of the same first conductive layer M1 as that of the wires 133A, 133B, 133C, and 133D. In such a case, the shield patterns 15A, 15B, 15C, 15D, 15E, and 15F have an opening 30.

In this variation, the shield pattern 15A has an opening 30. In other words, the area of the shield pattern 15A can be reduced by the area of the opening 30.

Therefore, even when the shield pattern 15A and the wire 133A are simultaneously formed, the influence of the formation of the shield pattern 15A on that of the wire can be suppressed.

As a result, the occurrence of difference in thickness between a part of the wire 133A that is adjacent to the shield pattern 15A and the remaining part of the wire 133A that is not adjacent to the shield pattern 15A can be suppressed.

Figure 9:
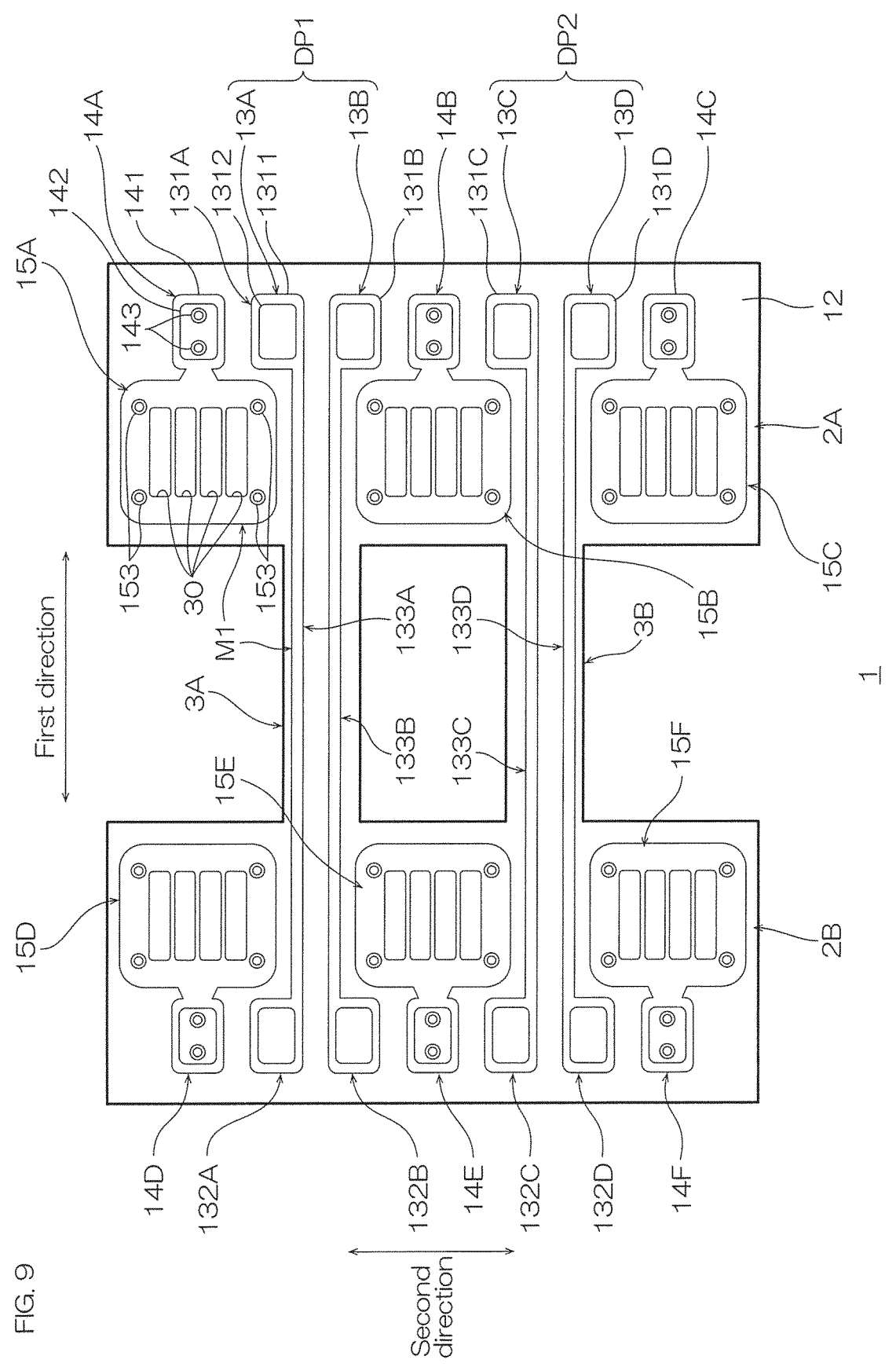
FIG. 9 is a plan view of the wiring circuit board of a variation (3).

(3) As shown in FIG. 9, the shield patterns 15A, 15B, 15C, 15D, 15E, and 15F may have a plurality of openings 30. The shape of the opening 30 is not limited.

Figure 10:
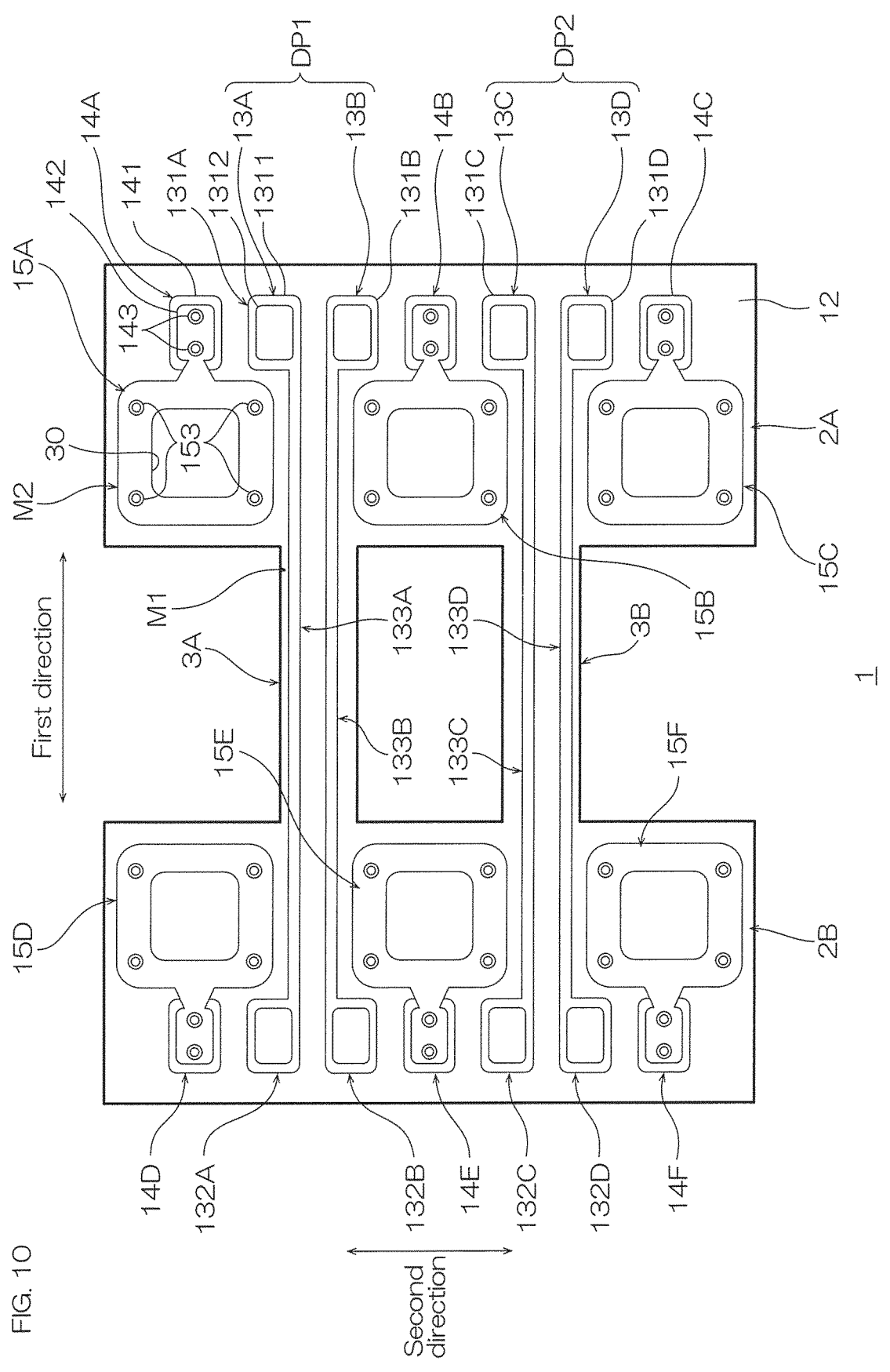
FIG. 10 is a plan view of the wiring circuit board of a variation (4).

(4) As shown in FIG. 10, even when the shield patterns 15A, 15B, 15C, 15D, 15E, and 15F have an opening 30, the shield patterns 15A, 15B, 15C, 15D, 15E, and 15F may be formed from a different second conductive layer M2 from the first conductive layer M1 forming the wires 133A, 133B, 133C, and 133D.

(5) The shield patterns 15A, 15B, 15C, 15D, 15E, and 15F may be independent from the ground terminals 14A, 14B, 14C, 14D, 14E, and 14F. The shield patterns 15A, 15B, 15C, 15D, 15E, and 15F may not be connected with the ground terminals 14A, 14B, 14C, 14D, 14E, and 14F.

(6) Also in the variations (1) to (5), the same operations and effects as those of the above-described embodiment can be achieved.

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

The wiring circuit board of the present invention is used for the connection to an electronic component. The method of producing the wiring circuit board of the present invention is used for producing wiring circuit boards.

DESCRIPTION OF REFERENCE NUMERALS 1 wiring circuit board
2A frame portion
3A flexible portion
11 metal supporting layer
12 first insulating layer (an example of an insulating layer)
13A wiring pattern
131A terminal
1311 first layer
1312 second layer
133A wire
15A shield pattern
30 opening M1 first conductive layer
M2 second conductive layer

The invention claimed is:

1. A wiring circuit board comprising:

an insulating layer;

a wiring pattern disposed at one side of the insulating layer in a thickness direction of the insulating layer and including a terminal and a wire connected with the terminal; and a shield pattern disposed at the one side of the insulating layer in the thickness direction and spaced apart from and adjacent to a part of the wire, wherein the wire is made of a first conductive layer, wherein the shield pattern is made of a second conductive layer, and wherein the shield pattern has a thickness different from a thickness of the wire.

2. The wiring circuit board according to claim 1, wherein the terminal includes:

a first layer disposed at the one side of the insulating layer in the thickness direction and made of the first conductive layer; and a second layer disposed at one side of the first layer in the thickness direction and made of the second conductive layer.

3. The wiring circuit board according to claim 1, wherein the terminal includes:

a first layer disposed at the one side of the insulating layer in the thickness direction and made of the second conductive layer; and a second layer disposed at one side of the first layer in the thickness direction and made of the first conductive layer.

4. The wiring circuit board according to claim 1, wherein the second conductive layer is thicker than the first conductive layer.

5. The wiring circuit board according to claim 1, wherein the first conductive layer is thicker than the second conductive layer.

6. The wiring circuit board according to claim 1, wherein the wiring circuit board includes:

a frame portion on which the terminal is disposed; and a flexible portion which is connected with the frame portion and more flexible than the frame portion, and on which the wire is disposed, wherein the shield pattern is disposed on the frame portion and is not disposed on the flexible portion.

7. The wiring circuit board according to claim 1, further comprising:

a metal supporting layer disposed at the other side of the insulating layer in the thickness direction.

8. The wiring circuit board according to claim 7, wherein the shield pattern is electrically connected with the metal supporting layer.

9. A method of producing the wiring circuit board according to claim 1, the method comprising:

a wire formation step of forming the wire at the one side of the insulating layer in the thickness direction; and a shield pattern formation step of forming the shield pattern at the one side of the insulating layer in the thickness direction.

10. A wiring circuit board comprising:

an insulating layer;

a wiring pattern disposed at one side of the insulating layer in a thickness direction of the insulating layer and including a terminal and a wire connected with the terminal; and a shield pattern disposed at the one side of the insulating layer in the thickness direction, spaced apart from and adjacent to a part of the wire, and having an opening, wherein the opening is provided within the shield pattern.

11. The wiring circuit board according to claim 10, wherein the wire is made of a first conductive layer, and wherein the shield pattern is made of a second conductive layer.

12. The wiring circuit board according to claim 11, wherein the terminal includes:

a first layer disposed at the one side of the insulating layer in the thickness direction and made of the first conductive layer; and a second layer disposed at one side of the first layer in the thickness direction and made of the second conductive layer.

13. The wiring circuit board according to claim 11, wherein the terminal includes:

a first layer disposed at the one side of the insulating layer in the thickness direction and made of the second conductive layer; and a second layer disposed at one side of the first layer in the thickness direction and made of the first conductive layer.

14. The wiring circuit board according to claim 11, wherein the second conductive layer is thicker than the first conductive layer.

15. The wiring circuit board according to claim 11, wherein the first conductive layer is thicker than the second conductive layer.

16. The wiring circuit board according to claim 10, wherein the wiring circuit board includes:

a frame portion on which the terminal is disposed; and a flexible portion which is connected with the frame portion and more flexible than the frame portion, and on which the wire is disposed, wherein the shield pattern is disposed on the frame portion and is not disposed on the flexible portion.

17. The wiring circuit board according to claim 10, further comprising:

a metal supporting layer disposed at the other side of the insulating layer in the thickness direction.

18. The wiring circuit board according to claim 17, wherein the shield pattern is electrically connected with the metal supporting layer.

19. A method of producing the wiring circuit board according to claim 10, the method comprising:

a wire formation step of forming the wire at the one side of the insulating layer in the thickness direction; and a shield pattern formation step of forming the shield pattern at the one side of the insulating layer in the thickness direction.

* * * * *